United States Patent
Morinaga et al.

(10) Patent No.: US 10,450,651 B2
(45) Date of Patent: Oct. 22, 2019

(54) ARTICLE COMPRISING METAL OXIDE-CONTAINING COATING

(71) Applicant: FUJIMI INCORPORATED, Kiyosu-shi, Aichi (JP)

(72) Inventors: Hitoshi Morinaga, Kiyosu (JP); Kazusei Tamai, Kiyosu (JP); Maiko Asai, Kiyosu (JP); Hiroaki Mizuno, Kiyosu (JP); Kyohei Ota, Kiyosu (JP)

(73) Assignee: FUJIMI INCORPORATED, Kiyosu-Shi, Aichi (JP)

(*) Notice: Subject to any disclaimer, the term of this patent is extended or adjusted under 35 U.S.C. 154(b) by 570 days.

(21) Appl. No.: 14/761,498

(22) PCT Filed: Nov. 27, 2013

(86) PCT No.: PCT/JP2013/081932
§ 371 (c)(1),
(2) Date: Jul. 16, 2015

(87) PCT Pub. No.: WO2014/112218
PCT Pub. Date: Jul. 24, 2014

(65) Prior Publication Data
US 2015/0354058 A1   Dec. 10, 2015

(30) Foreign Application Priority Data
Jan. 18, 2013 (JP) .................. 2013-007940

(51) Int. Cl.
*C23C 4/08* (2016.01)
*B32B 3/00* (2006.01)
(Continued)

(52) U.S. Cl.
CPC ............ *C23C 16/40* (2013.01); *B24B 37/042* (2013.01); *C09G 1/02* (2013.01); *C09K 3/1409* (2013.01);
(Continued)

(58) Field of Classification Search
CPC ........... C23C 16/40; C23C 4/11; C23C 4/134; C23C 14/08; C23C 30/00
See application file for complete search history.

(56) References Cited

U.S. PATENT DOCUMENTS

| | | |
|---|---|---|
| 4,861,657 A | 8/1989 | Nishino et al. |
| 5,723,221 A | 3/1998 | Brooker et al. |

(Continued)

FOREIGN PATENT DOCUMENTS

| | | |
|---|---|---|
| EP | 0 762 491 A2 | 3/1997 |
| JP | S49-20037 A | 2/1974 |

(Continued)

OTHER PUBLICATIONS

Asahara et al., Metal surface finishing technology course 8', Anodization, The Surface Finishing Society of Japan, First Edition, Aug. 25, 1969, p. 10.

*Primary Examiner* — Laura A Auer
(74) *Attorney, Agent, or Firm* — Foley & Lardner LLP

(57) ABSTRACT

Provided is an article having a novel surface with a texture different from conventional kinds. The article having a metal oxide-containing coating provided by the present invention comprises a substrate and a metal oxide-containing coating provided to the substrate surface. The metal oxide-containing coating has a Vickers hardness of 350 or higher, a surface roughness Ra of 300 nm or less, and a 20° gloss value of 50 or higher.

19 Claims, 3 Drawing Sheets

(51) Int. Cl.
  *B32B 18/00*   (2006.01)
  *C23C 16/40*   (2006.01)
  *C09K 3/14*    (2006.01)
  *B24B 37/04*   (2012.01)
  *C23C 14/08*   (2006.01)
  *C23C 30/00*   (2006.01)
  *C23C 4/18*    (2006.01)
  *C23C 4/11*    (2016.01)
  *C23C 4/134*   (2016.01)
  *C09G 1/02*    (2006.01)

(52) U.S. Cl.
  CPC ............... *C23C 4/11* (2016.01); *C23C 4/134* (2016.01); *C23C 4/18* (2013.01); *C23C 14/08* (2013.01); *C23C 30/00* (2013.01); *Y10T 428/24355* (2015.01)

(56) References Cited

U.S. PATENT DOCUMENTS

| | | |
|---|---|---|
| 6,227,949 B1 | 5/2001 | Yi et al. |
| 8,025,978 B2 | 9/2011 | Ruhdorfer |
| 2006/0110320 A1 | 5/2006 | Aoki et al. |
| 2006/0130522 A1* | 6/2006 | Fukumoto ............. C03B 11/086 65/24 |
| 2008/0199672 A1 | 8/2008 | Ruhdorfer |
| 2010/0026751 A1 | 2/2010 | Oyanagi |
| 2010/0159273 A1* | 6/2010 | Filson ................... B32B 15/012 428/653 |
| 2010/0331167 A1* | 12/2010 | Ohta ................. C04B 35/58007 501/96.1 |
| 2011/0183091 A1* | 7/2011 | Zhu .......................... C23C 4/02 428/34.6 |
| 2011/0214993 A1* | 9/2011 | Akana ...................... C25D 5/00 205/50 |
| 2012/0000784 A1* | 1/2012 | Shin ..................... C25D 11/024 205/50 |
| 2013/0029097 A1* | 1/2013 | Chen ...................... C23C 28/30 428/141 |
| 2013/0324015 A1 | 12/2013 | Asano et al. |

FOREIGN PATENT DOCUMENTS

| | | |
|---|---|---|
| JP | S53-1648 A | 1/1978 |
| JP | 61-281880 A | 12/1986 |
| JP | S62-142021 A | 6/1987 |
| JP | H06-330386 A | 11/1994 |
| JP | 2000-290524 A | 10/2000 |
| JP | 2006-039407 A | 2/2006 |
| JP | 2006-144094 A | 6/2006 |
| JP | 2008-173796 A | 7/2008 |
| JP | 2008-540176 A | 11/2008 |
| JP | 2009-061556 A | 3/2009 |
| JP | 2010-30139 A | 2/2010 |
| WO | WO 2011/028392 A1 | 3/2011 |
| WO | WO 2012/115020 A1 | 8/2012 |

* cited by examiner

[Fig. 1]
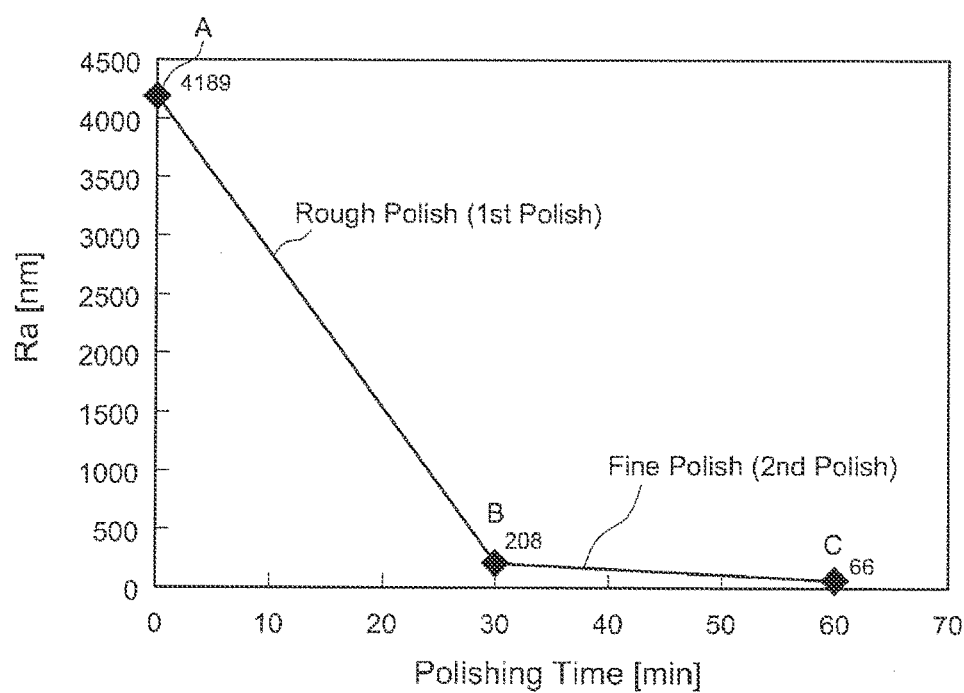
[Fig. 2]
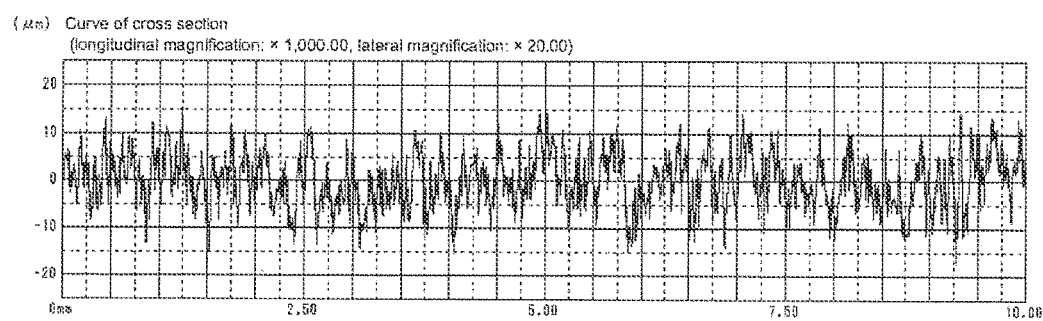

[Fig. 3]
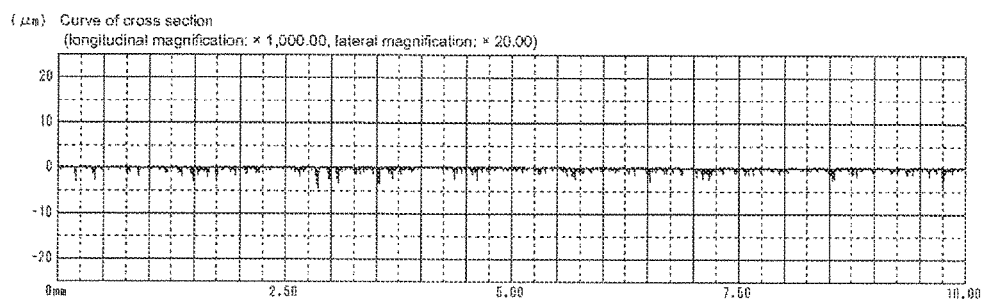
[Fig. 4]
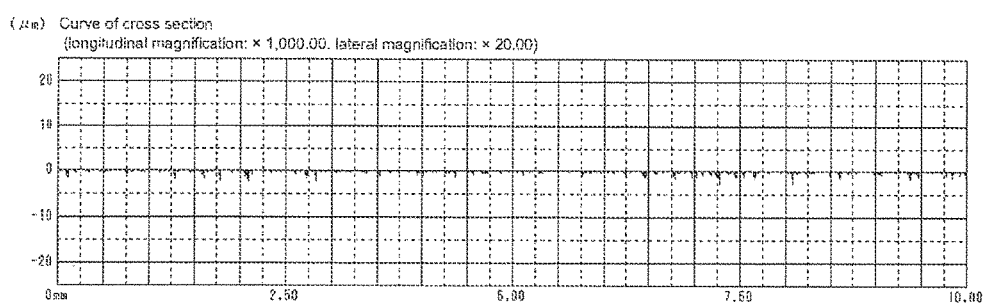
[Fig. 5]
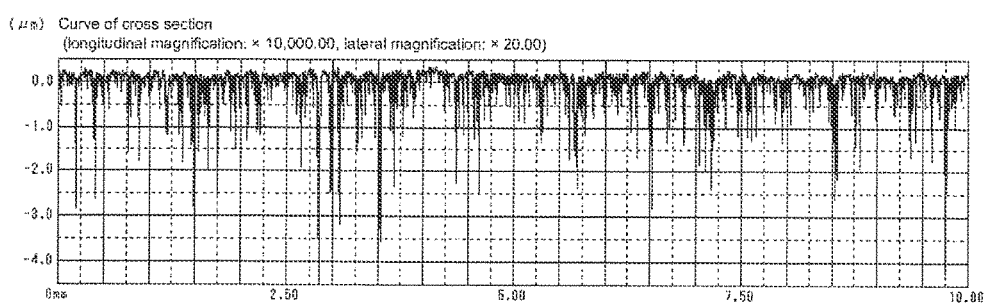

[Fig. 6]
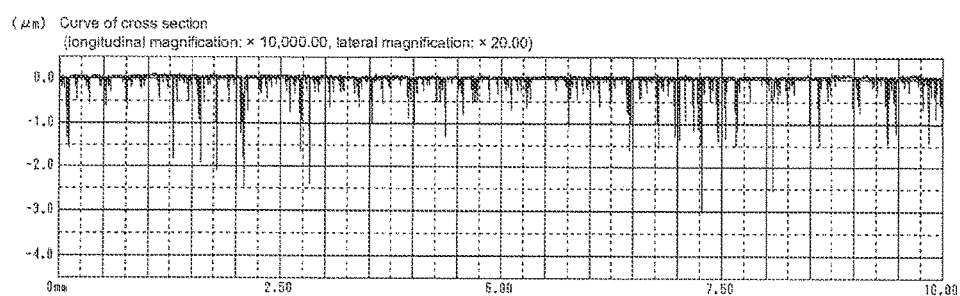

ARTICLE COMPRISING METAL OXIDE-CONTAINING COATING

TECHNICAL FIELD

The present application claims priority to Japanese Patent Application No. 2013-7940 filed on Jan. 18, 2013, and the entire contests thereof are incorporated herein by reference.

BACKGROUND ART

For surface protection or as design features, etc., surface finishes such as resin coating, metal plating and the like are provided to surfaces of various electronics such as mobile phones and personal computers (PCs), cameras, sporting and healthcare goods, automobile interior components, and other articles. These surface finishes are required to have characteristics such as prescribed strength, durability and lightness depending on the article subject to the surface finishing and are provided with a wide variety of design elements. In particular, there is strong demand for surface design in electronics, automobile interior components, etc. For instance, high-grade products strongly demand surface designs oriented to the quality (e.g. luxurious quality). However, there are limitations, material-wise, process-wise, etc., to conventional surface processing techniques such as resin coating, metal plating and the like, whereby improvement of texture is hindered. If the surfaces of these articles can be provided with different textures from the conventional kinds, products that provide higher consumer satisfaction can be beneficially made.

In industrial applications such as semiconductor manufacturing device, etc., for erosion prevention and the like purpose, the product surfaces have been conventionally coated with a metal oxide such as alumina, etc. Technical literatures disclosing this type of conventional art include Patent Document 1. Patent Document 2 suggests a polishing composition that allows polishing of hard materials such as sapphire, gallium nitride, etc., at certain polishing rates.

CITATION LIST

Patent Literature

[Patent Document 1] Japanese Patent Application Publication No. 2006-144094
[Patent Document 2] International Publication No. 2012/115020

SUMMARY OF INVENTION

Technical Problem

Under an idea of providing surfaces of various types of articles with unique textures of metal oxide-containing materials (e.g. ceramic), as a result of earnest studies, the present inventors have made the present invention. An objective of this invention is thus to provide an article comprising a novel surface having a different texture from conventional kinds. Another related objective is to provide a method for producing an article comprising the novel surface. Another related objective encompasses providing a polishing kit capable of producing the novel surface.

Solution to Problem

To achieve the objectives, this description provides an article having a metal oxide-containing coating (which may be referred to simply as a metal oxide-coated article, hereinafter). The metal oxide-coated article comprises a substrate and a metal oxide-containing coating provided to a surface of the substrate. The metal oxide-containing coating has a Vickers hardness of 350 or higher, a surface roughness Ra of 300 nm or less, and a 20° gloss value of 50 or higher. Since the coating includes the metal oxide, it has different texture from resin coatings, metal plating, etc. Herein, the texture refers to the material's feel unique to the metal oxide-containing material. For instance, it can be expressed in terms of its denseness or presence. It may also create different color tones from metals and resins. The texture is different from, for instance, metallic or plastic texture. It has depth and warmth as well as unique luster, which can provide the aesthetic appearance and luxurious quality of pottery and porcelain to the look and feel. The metal oxide-containing coating has a 20° gloss value, of 50 or higher and thus, has lustrous texture different from surface coatings on conventional articles. The lustrous surface may have an aesthetic appearance and luxurious quality different from, but comparable to or greater than, those of pottery and porcelain as fine arts and crafts. An article having a highly smooth surface may be excellent to the touch as well as in terms of strength such as impact resistance, etc.

In a preferable embodiment of the art disclosed herein, the metal oxide-containing coating is a coating formed by a spraying method, chemical vapor deposition (CVD) method or physical vapor deposition (PVD) method. These methods can be employed to preferably form a metal oxide-containing coating on a substrate surface.

In a preferable embodiment of the art disclosed herein, the metal oxide-containing coating is porous and has a porosity of 1 to 20%. According to the art disclosed herein, the porous coating having such porosity can be preferably made to have a surface roughness Ra of 300 nm or less and a 20° gloss value of 50 or higher.

In a preferable embodiment of the art disclosed herein, the metal oxide-containing coating has a thickness of 10 μm to 1000 μm. Too small a thickness of metal oxide-containing coating tends to hardly produce certain luster while too large a thickness tends to decrease the productivity. From the standpoint of the lightness, the thickness is desirably 1000 μm or smaller.

This description also provides a method for producing a metal oxide-coated Article. The production method comprises a step of forming a metal oxide-containing coating having a Vickers hardness of 350 or higher on a surface of a substrate of an article, and a step of polishing the surface of the metal oxide-containing coating. The metal oxide-containing coating after the polishing step is characterized by having a surface roughness Ra of 300 nm or less and a 20° gloss value of 50 or higher. According to the production method, the metal oxide-containing coating having at least the proscribed hardness can be polished to have a surface with certain luster. Furthermore, an article can be produced, having a surface with a metal oxide-containing coating formed thereon which may produce an aesthetic appearance and luxurious quality different from, but comparable to or greater than those of, for instance, pottery and porcelain as fine arts and crafts.

In a preferable embodiment of the production method disclosed herein, the metal oxide-containing coating is formed by a spraying method, CVD method or PVD method. In another preferable embodiment, the metal oxide-containing coating is porous and has a porosity of 1 to 20%. The metal oxide-containing coating preferably has a thickness of 10 μm to 1000 μm.

In a preferable embodiment of the production method disclosed herein, the polishing step comprises a first polishing step where the surface of the metal oxide-containing coating formed is polished with a first polishing composition, and a second polishing step where the surface of the metal oxide-containing coating after the first polishing step is polished with a second polishing composition. By subjecting the metal oxide-containing coating having at least the prescribed hardness to at least the two polishing steps, a surface having certain luster can be efficiently produced. Furthermore, it allows for mass production of an article having a surface with a metal oxide-containing coating formed thereon which may produce an aesthetic appearance and luxurious quality different from, but comparable to or greater than those of, for instance, pottery and porcelain as fine arts and crafts.

In a preferable embodiment of the production method disclosed herein, the first polishing composition comprises an abrasive (A1) and the second polishing composition comprises an abrasive (A2) having a smaller average secondary particle diameter than the abrasive (A1), with the average secondary particle diameter of the abrasive (A2) being 500 nm or smaller. The use of the two different polishing compositions having the compositions described above can efficiently produce a metal oxide-containing coating surface having certain luster.

In a preferable embodiment of the production method disclosed herein, the abrasive (A1) has an average secondary particle diameter of 1 μm to 10 μm. By polishing with the first polishing composition that comprises the abrasive (A1) having such particle diameters, a high polishing efficiency can be achieved.

In a preferable embodiment of the production method disclosed herein, the abrasive (A1) has an average secondary particle diameter $P_1$ and the abrasive (A2) has an average secondary particle diameter $P_2$ at a ratio $(P_1/P_2)$ between 2 and 200. With the average secondary particle diameter ratio $(P_1/P_2)$ of abrasive (A1) to abrasive (A2) being in this range, a surface having certain luster can be efficiently produced.

This description also provides a polishing kit for metal oxide-containing coatings for use in a production method disclosed herein. The polishing kit comprises a first polishing composition and a second polishing composition. The first polishing composition comprises an abrasive (A1). The second polishing composition comprises an abrasive (A2) having a smaller average secondary particle diameter than the abrasive (A1) and the average secondary particle diameter of the abrasive (A2) is 500 nm or smaller. In polishing with such a polishing kit, a surface having certain luster can be efficiently produced by performing at least two polishing steps where a metal oxide-containing coating having at least a prescribed hardness is subjected to the first polishing step using the first polishing composition and the second polishing step using the second polishing composition.

This description also provides a polishing hit for metal oxide-containing coatings. The object to be polished with the polishing kit is a metal oxide-containing coating that comprises a metal oxide and has a Vickers hardness of 350 or higher. The polishing kit is used for polishing the metal oxide-containing coating to a surface roughness Ra of 300 nm or less and a 20° gloss value of 50 or higher. The polishing kit comprises a first polishing composition supplied to the metal oxide-containing coating and a second polishing composition supplied to the metal oxide-containing coating after the supply of the first polishing composition. The first polishing composition comprises an abrasive (A1). The second polishing composition comprises an abrasive (A2) having a smaller average secondary particle diameter than the abrasive (A1) and the average secondary particle diameter of the abrasive (A2) is 500 nm or smaller.

BRIEF DESCRIPTION OF DRAWINGS

FIG. 1 shows a graph of changes in surface roughness Ra of metal oxide-containing coating during polishing according to Example 3.

FIG. 2 shows a chart (longitudinal magnification; 1,000.00×, lateral magnification: 20.00×) of measured surface roughness Ra (curve of cross section) data at point A in FIG. 1.

FIG. 3 shows a chart (longitudinal magnification; 1,000.00×, lateral magnification: 20.00×) of measured surface roughness Ra (curve of cross section) data at point B in FIG. 1.

FIG. 4 shows a chart (longitudinal magnification; 1,000.00×, lateral magnification: 20.00×) of measured surface roughness Ra (curve of cross section) data, at point C in FIG. 1.

FIG. 5 shows a chart of measured surface roughness Ra (curve of cross section) data at point B in FIG. 1, the same as FIG. 3, but magnified in the vertical direction (longitudinal magnification; 10,000.00×, lateral magnification: 20.00×).

FIG. 6 shows a chart of measured surface roughness Ra (curve of cross section) data at point C in FIG. 1, the same as FIG. 4, but magnified in the vertical direction (longitudinal magnification; 10,000.00×, lateral magnification: 20.00×).

DESCRIPTION OF EMBODIMENTS

Preferred embodiments of the present invention are described below. Matters necessary to implement this invention other than those specifically referred to in this description may be understood as design matters to a person of ordinary skill in the art based on the conventional art in the pertinent field. The present invention can be implemented based on the contents disclosed in this description and common technical knowledge in the subject field.

<<Metal Oxide-Coated Article>>
<Article>

The metal oxide-coated article according to a preferable embodiment of the art disclosed herein comprises a substrate and a metal oxide-containing coating provided on a surface of the substrate. The article can be an electronic device such as a mobile phone, gaming device, PC, various types of home appliance, various types of audio product, etc.; camera, optical supply, office supply, sports and healthcare equipment, automobile interior component, lightning equipment, furniture, interior ornament, cookware, sundry article, and so on. Typically, it can be an article (product or article of manufacture) for general consumers. Application of the metal oxide-containing coating as a surface of an article for general consumers can be thought as a characteristic of the art disclosed herein.

In particular, electronic devices, cameras, optical supplies and automobile interior components greatly tend to demand surface designs oriented to the texture (especially Luxurious quality) and thus are preferable targets of the art disclosed herein. It is particularly preferable to apply the art disclosed herein to a type of article that come in several grades of product differing in price range, etc., depending on the features. For instance, by applying the art disclosed herein to a high-grade product (e.g. a product with high-spec features and performance) among these articles, the features and performance of the article can be associated with the surface texture (typically the luxurious appearance) of the article, whereby the product can be made to provide higher consumer satisfaction.

In a preferable embodiment of the art disclosed herein, the article is preferably for use by hand. This is because the unique texture of the metal oxide-containing coating can be appreciated as the feel and temperature when held in hand. The temperature is a type of texture that can be sensed when actually held in hand and is perceived as a texture unique to the metal oxide that cannot be obtained with metal or resin. Preferable examples of such an article include electronic devices, cameras, etc.

<Substrate>

The substrate is a member constituting the article and can be the article itself. The substrate can be typically a member constituting an outer surface (e.g. outer shell) of the article. The substrate should just have at least a surface available for coating and is not particularly limited to that extent. For instance, a bulky or planar substrate can be preferably used.

When the metal oxide-containing coating is thermally formed on the substrate surface, from the standpoint of preventing substrate deformation caused by the heat, the substrate is preferably formed of a material that is not susceptible to melting or combustion below 300° C. (e.g. below 500° C., typically below 600° C.). When the metal oxide-containing coating is formed by the spraying method, CVD method or PVD method described later, the substrate is preferably formed of a material that is not susceptible to melting or combustion below 600° C. (e.g. below 1000° C., typically below 1500° C.).

In view of forming a coating as described above, the substrate is preferably formed of a metallic material such as stainless steel, nickel, titanium, aluminum, magnesium, iron, copper or any of alloys comprising these as primary components (components accounting for the largest mass fraction in the substrate, e.g. a component accounting for more than 50% by mass of the substrate's total mass); or a non-metallic material such as a carbon material. From the standpoint of the workability, stainless steel, aluminum, iron and copper are preferable. These are highly workable, yet are relatively easily damaged (has low scratch resistance). Thus, they can benefit from the advantages of the metal oxide-containing coating formation disclosed herein. From the standpoint of the anti-erosion, stainless steel, aluminum and titanium are preferable. From the standpoint of the lightness, aluminum and titanium are preferable. When the article is used in an embodiment exposed to high temperatures, or when the metal oxide-containing coating is formed at a high temperature, the material of the substrate is preferably stainless steel, nickel, titanium, iron, copper, any of alloys comprising these as primary components, a carbon material, etc.

The thickness of the substrate is not particularly limited. From the standpoint of the ease of forming the metal oxide-containing coating, it is suitably about 0.1 mm or larger (e.g. 0.3 mm or larger, typically 0.6 mm or larger), or preferably 0.5 mm or larger (e.g. 1 mm or larger, typically 2 mm or larger). From the standpoint of the lightness, the thickness is suitably about 50 mm or smaller (e.g. 5 mm or smaller, typically 3 mm or smaller), or preferably 10 mm or smaller (e.g. 2 mm or smaller, typically 1 mm or smaller).

<Metal Oxide-Containing Coating>

In the metal oxide-coated article disclosed herein, the metal oxide-containing coating is formed on a surface of the substrate. For instance, the metal oxide-containing coating can be a coating provided at least partially to an externally visible region of the article. In typical, it may be formed on a surface of the article (e.g. a substrate). When formed in such a region, the unique texture (luxurious quality) of the metal oxide-containing coating disclosed herein is provided to the surface of the article, thereby presenting an excellent design feature. In particular, since the metal oxide-containing coating can be a thin coating, even when the article itself is lightweight, the unique texture (which can be expressed as, for instance, the denseness or presence) of the metal oxide-containing coating can be exhibited. In other words, denseness or presence can be combined with lightness.

In terms of design features, the metal oxide-containing coating is preferably colored. The concept of "being colored" referred to herein encompasses all colors, but colorless transparency and may include semi-transparency. The colored metal oxide-containing coating may exhibit a unique color tone because of the unique texture of the metal oxide. Needless to say since the metal oxide-containing coating is excellent also in heat resistance, wear resistance (including scratch resistance), anti-discoloration (anti-fading), erosion resistance and insulating ability, it can provide great surface protection for the substrate.

The metal oxide-coated article may be excellently lightweight as compared with an article (e.g. substrate) entirely formed of the metal oxide-containing material. The metal oxide-containing coating can be manufactured efficiently because it can be formulated to easily produce desirable surface properties (typically a surface roughness Ra of 300 nm or less and a 20° gloss value of 50 or higher), for instance, by adjusting the properties and composition (e.g. porosity) of the coating. By constituting a portion requiring no surface luster (e.g. the back face of the substrate) with a suitable material, this portion can be provided with a complex structure. In other words, the metal oxide-coated article disclosed herein can be excellent in workability and further in geometric adaptability made available by the excellent workability.

The metal(s) constituting the metal oxide in the metal oxide-containing coating can be, for instance, one, two or more species selected among metals such as Mg, Ca, Sr, Ba, Sc, Y, La, Ti, Zr, Hf, Y, Nb, Ta, Cr, Mo, W, Mn, Fe, Co, Ni, Cu, Ag, Au, Zn, Al, Ga, In, Sn, Pb, Bi, Ce, Pr, Nd, Er, Lu, etc.; and metalloids such as B, Si, Ge, Sb, etc. In particular, it is preferable to include one, two or more species selected from Mg, Y, Ti, Zr, Cr, Mn, Fe, Zu, Al, and Er.

While specific examples of the metal oxide are not particularly limited, examples include MgO, CaO, SrO, $Sc_2O_3$, $Y_2O_3$, $La_2O_3$, $TiO_2$, $ZrO_2$, $HfO_2$, $VO_X$ (e.g. $V_2O_5$), $Nb_2O_3$, $Ta_2O_5$, $CrO_X$ (e.g. $Cr_2O_4$), $WO_X$ (e.g. $WO_2$, $WO_3$), $MnO_X$ (e.g. MnO, $MnO_2$, $Mn_3O_4$), $FeO_X$, $CoO_X$, NiO, CuO, AgO, ZnO, $Al_2O_3$, $Ga_2O_3$, $In_2O_3$, $SnO_2$, $BiO_X$, $CeO_2$, $PrO_X$, $Nd_2O_3$, $Er_2O_3$, $Lu_2O_3$, $ZrSiO_X$, $ZrAlO_X$, $HfSiO_X$, $HfAlO_X$, $TiSi_XO_Y$, $B_2O_3$, $SiO_2$, $GeO_2$, $Sb_2O_5$, and the like. These can be used solely as one species or as a mixture of two or more species. In the art disclosed herein, it provides certain gloss to the surface of the metal oxide-containing coating. Thus, the metal oxide can be defined to be free of a transparent material such as glass made of a silicate, etc. It may be free of Si atoms.

The metal oxide content in the metal oxide-containing coating is not particularly limited. From the standpoint of preferably producing the unique texture of the metal oxide, the metal oxide content is suitably about 20% by mass or greater (e.g. 40% by mass or greater, typically 60% by mass or greater), preferably 80% by mass or greater (typically 80 to 99.99% by mass), more preferably 90% by mass or greater (typically 90 to 99.99% by mass), or particularly preferably 95% by mass or greater (e.g. 95 to 99.99% by mass, typically 99 to 99.99% by mass). In the same viewpoint, the metal oxide-containing coating is preferably free of an organic material and a metallic material.

The metal oxide-containing coating disclosed herein may have a Vickers hardness (Hv) of 350 or higher. The art disclosed herein can bring about a coating as hard as the above to exhibit at least a certain gloss value. The Vickers hardness can be 400 or higher (e.g. 500 or higher typically 700 or higher). Even if it is 800 or higher (typically 900 or higher), by applying the art disclosed herein, the surface of the metal oxide-containing coating can exhibit a 20° gloss value of 50 or higher. The upper limit of Vickers hardness is not particularly limited, but is preferably below 1500 (e.g. below 1400, typically below 1200). Too large a Vickers hardness may decrease the polishing rate and reduce the productivity. Vickers hardness can be measured based on JIS R1610 corresponding to ISO 14705.

The metal oxide-containing coating may be porous. Because the porous coating has pores, if with too high a porosity, for instance, even polishing may be less likely to produce busier. Thus, in view of the surface luster, the metal oxide-containing coating preferably has a low porosity. For instance, the porosity of the metal oxide-containing coating is preferably about 20% or lower. From the standpoint of the appearance of luster, the porosity is preferably 15% or lower, more preferably 12% or lower, or particularly preferably 10% or lower. Studies by the present inventors have revealed that when the porosity is too small, it tends to be hard to increase the surface smoothness and achieve a practical polishing rate at the same time, conversely hindering luster production. In view of this, the porosity is preferably 0.5% or higher (e.g. 1% or higher, typically 3% or higher). The porosity can be adjusted through conditions (e.g. temperature, particle diameter of the material used) for forming the metal oxide-containing coating. For the porosity, can be used the value of area ratio of pores (voids) per unit area determined by image analysis based on a cross-sectional image of the metal oxide-containing coating by scanning electron microscopy (SEM, e.g. at 500× magnification). For the porosity, it is preferable to use the average of values determined from cross-sectional images of three or more arbitrary locations. As understood from this, the % porosity in this description is by apparent volume, but is allowed to be expressed in "% by volume" for convenience.

The metal oxide-containing coating disclosed herein is characterized by a surface thereof having a 20° gloss value of 50 or higher. By this, the metal oxide-containing coating is provided with certain luster, cresting an article surface having a texture (typically luxurious quality) distinct from those in conventional art. The article surface having such luster is smooth and fine to the feel. Thus, when held in hand, it may feel great. The 20° gloss value of the metal oxide-containing coating is preferably 70 or higher, more preferably 80 or higher, or yet more preferably 90 or higher. When particular importance is placed on the luster, the 20° gloss value can be even 200 or higher. 20° gloss values can be measured based on JIS Z8741. The gloss meter used for measurements is not particularly limited. A heretofore known gloss meter can be used. For instance, trade name "GM-268PLUS" available from Konica Minolta Optics, Inc., or a similar product can be used for measurements.

The metal oxide-containing coating preferably has a surface roughness Ra of 350 nm or lees. When the surface roughness Ra is 300 nm or less, the surface smoothness tends to increase, likely producing a lustrous surface. With the smooth surface, the metal oxide-containing coating has fewer possible cracking points and is less susceptible to breakage, thereby also being excellent in aspects of strength such as impact resistance, durability and so on. In addition, the article with the highly smooth surface feels great in hand. It is noted that a low surface roughness Ra does not necessarily mean high luster. The surface roughness Ra is preferably 250 nm or less, more preferably 200 nm or less, or particularly preferably 150 nm or less. The lower limit of surface roughness Ra is not particularly limited. From the standpoint of the polishing efficiency, etc., it can be about 10 nm or greater (typically 30 nm or greater). Surface roughness Ra in this description can be measured with a heretofore known surface roughness tester (e.g. "SURFCOM 1500DX" available from Tokyo Seimitsu Co., Ltd. or a similar product). The measurement can preferably be taken, for instance, over a measured length of 10 mm, at a measurement rate of 0.3 mm/sec.

The metal oxide-containing coating preferably has four or less colored spots per $cm^2$ of surface area. The metal oxide-containing coating with such few colored spots may likely be excellent in luster, texture and luxurious quality. The number of colored spots is preferably one or less (e.g. 0.7 or less, typically less than 0.3) per $cm^2$ of surface area of metal oxide-containing coating. Colored spots can be reduced by a selection of a raw material (e.g. metal oxide particles) for the metal oxide-containing coating. The number of colored spots can be measured, for instance, by the following method: With respect to a metal oxide-containing coating provided on a substrate surface, the surface is observed at arbitrary 50 locations with an optical microscope at 100 times magnification. The observation images at the 50 locations by the optical microscope are then converted to 256-level grayscale and regions having lowest intensity values of 100 or less and diameters of 30 μm or larger are counted as the number of colored spots. The resulting number of colored spots is divided by the total surface area to determine the number of colored spots per unit area (1 $cm^2$) present on the surface of the metal oxide-containing coating.

The thickness of the metal oxide-containing coating is not particularly limited. From the standpoint of producing certain luster, it desirably has at least a certain thickness. For instance, the thickness is preferably 10 μm or larger, more preferably 50 μm or larger, or yet more preferably 100 μm or larger. From the standpoint of the lightness and productivity, the thickness is suitably 1000 μm or smaller, preferably 500 μm or smaller, or yet more preferably 400 μm or smaller. The thickness of the metal oxide-containing coating can be determined by suitably employing a heretofore known technique. For instance, it can be measured with a heretofore known coating thickness meter (e.g. "SME-2" available from Sanko Electronic Laboratory Co., Ltd. or a similar product, electromagnetic induction mode).

<<Method For Producing Metal Oxide-Coated Article>>

Preferable embodiments of the production method for the metal oxide-coated article disclosed herein are described next. The production method comprises at least a step of forming a metal oxide-containing coating having a Vickers hardness of 350 or higher on a surface of a substrate; and a step of polishing a surface of the metal oxide-containing coating formed. Besides these step, the production method disclosed herein may comprise obtaining the substrate, fabricating an article, etc. However, as these do not characterize the present invention, no particulars are provided herein. Matters related to polishing slurries such as preparation of polishing slurries, etc., are described later.

The metal oxide-containing coating formation step is a step of forming a metal oxide-containing coating having a Vickers hardness of 350 or higher on a surface of a substrate of an article, and is not limited to this extent. The Vickers hardness can be 400 or higher (e.g. 500 or higher, typically 700 or higher), or even 800 or higher (typically 900 or higher).

When the metal oxide-containing coating is porous, the porosity of the porous coating is not particularly limited. The production method disclosed herein can be, however, preferably applied to an article having a metal oxide-containing coating with a porosity of about 20% or lower (preferably 15% or lower, more preferably 12% or lower, yet more preferably 10% or lower). From the standpoint of increasing the surface smoothness and achieving a practical polishing rate at the same time, the porosity is preferably 0.5% or higher (e.g. 1% or higher typically 3% or higher). In the production method disclosed herein, at a suitable time, the porous coating can be subjected to a porosity-reducing treatment such as a sealing treatment.

The surface roughness Ra of the metal oxide-containing coating immediately after its formation on the substrate surface (i.e. before polished) is not particularly limited. From the standpoint of efficiently benefitting from the effects of the production method disclosed herein, the metal oxide-containing coating has a pre-polishing surface roughness Ra of suitably about 1000 nm or greater (e.g. 1500 nm or greater, typically 2000 nm or greater) or possibly 3000 nm or greater (e.g. 4000 nm or greater). The upper limit of the surface roughness Ra is not particularly limited and can be about 9000 nm or less. From the standpoint of efficiently producing the surface luster, it may be occasionally desirable to perform rough polishing (preliminary polishing) to a surface roughness Ra of less than 2000 nm before the first polishing step.

Examples of the method for forming such a hard metal oxide-containing coating include a spraying method, CVD method, PVD method, anodization, sol-gel method and the like. These do not require a wetting agent such as a flux, etc., and are thus less likely to contaminate the substrate. The spraying method can be arc spraying, plasma spraying, laser spraying, flame spraying, high-speed flame spraying, detonation flame spraying, cold spraying, and the like. The examples CVD method includes thermal CVD, plasma CVD, light/laser CVD and the like. The PVD method includes vacuum deposition, sputtering, ion plating, etc. In particular, spraying methods and CVD methods are preferable, and spraying methods are more preferable. Among spraying methods (thermal spraying methods), from the standpoint of preventing substrate deformation, plasma spraying and high-speed flame spraying are preferable, and plasma spraying is more preferable. As the plasma spraying, from the standpoint of forming a metal oxide-containing coating likely to yield a lustrous surface, plasma spraying with a low output below 50 kW is particularly preferable. The plasma spraying can be either atmospheric pressure plasma spraying or vacuum plasma spraying. Examples of the high-speed flame spraying include HVAF (high velocity air fuel), HVOF (high velocity oxygen fuel), and HP (high pressure)-HVOF. In particular, from the standpoint of forming a metal oxide-containing coating likely to yield a lustrous surface, HVOF and HP-HVOF are preferable, and HP-HVOF is more preferable.

Although not particularly limited, an example of the embodiment where the metal oxide-containing coating disclosed herein is formed by a spraying method (preferably a plasma spraying method) is described. A substrate (e.g. a metallic material such as aluminum or an alloy thereof, etc.) that constitutes an article is first obtained, and on a surface of the substrate, a metal oxide-containing coating is formed by a spraying method (preferably a plasma spraying method). To increase the binding between the substrate and metal oxide-containing coating, the substrate surface is preferably roughed up in advance by a physical method such as blasting, etc., or a chemical method such as etching, etc. Etching is more preferable for a thin or soft substrate. The spraying conditions (e.g. plasma gas species) are not particularly limited and heretofore known conditions can be suitably used. From the standpoint of reducing colored spots in the metal oxide-containing coating, spraying is preferably performed at a voltage of 36 V or lower. The spraying temperature and spraying distance can also be suitably selected from heretofore known ranges. From the standpoint of avoiding substrate deformation, the temperature of the substrate (on the surface to be sprayed) is preferably set to about 1000° C. or below (e.g. 800° C. or below, typically 600° C. or below). The porosity of the metal oxide-containing coating can also be adjusted by the spraying temperature and spraying distance.

The particle diameter of spray powder is not particularly limited. From the standpoint of the binding and yield, the particle diameter of spray particles is preferably large, while from the standpoint of the polishing rate and design feature, the particle diameter of spray particles is preferably small. For instance, spray particles having a 50th percentile (by volume) particle diameter $D_{50}$ of about 1 μm to 50 μm (e.g. 7 μm to 40 μm) can be preferably used. From the standpoint of balancing the binding, yield, polishing rate and design features at a high level, it is preferable to use a technique where after a spray coating (first spray layer) is formed with a spray powder having a $D_{50}$ of 10 μm or larger (e.g. 10 μm to 50 μm, typically 20 μm to 40 μm), another spray coating (second spray layer) is formed thereon with spray particles having a smaller $D_{50}$ (e.g. spray powder having a $D_{50}$ of 30 μm or smaller (typically 1 μm to 30 μm, preferably 5 μm to 20 μm, more preferably 7 μm to 18 μm)) than the spray particles used for forming the first spray layer. The porosity of the metal oxide-containing coating can be adjusted through the $D_{50}$ as well. $D_{50}$ can be determined from the size distribution measured based on a particle size analyzer by a laser scattering/diffraction method.

As described above, when the spray layer has a multi-layer structure with two or more layers, the compositions and thicknesses of the respective layers are not particularly limited. For instance, with respect to the first spray layer formed directly on the substrate surface, the binding to the substrate is important. Thus, it is preferably formed with spray particles of relatively large diameters. From the standpoint of combining tight binding and lightness, etc., the first spray layer preferably has a thickness of about 50 μm to 400 μm (e.g. 150 μm to 300 μm). With respect to the second spray layer formed on the first spray layer, design features and responsiveness to polishing are important. Thus, it is preferably formed with spray particles having relatively small diameters. The use of particles of small diameters may make the metal oxide-containing coating hard to see through. From the standpoint of combining design features and yield, etc., the thickness of the second spray layer is preferably about 10 μm to 300 μm (e.g. 50 μm to 150 μm).

In the spraying, to avoid substrate deformation, it is preferable to carry out a cooling process from the surface opposite the sprayed surface and adjust the spray angle (e.g.

setting the spray angle to 45° or greater but less than 90°). The cooling can be done by using a suitable coolant such as water cooling, etc.

A metal oxide-containing coating formed, for instance, as described above is subjected to the polishing step. In the polishing step, polishing is preferably performed with a polishing composition. Although not particularly limited, multi-step polishing is described below as a preferable example of the polishing step. The polishing step typically includes a first polishing step where the surface of the metal oxide-containing coating is polished with a first polishing composition and a second polishing step where the surface of the metal oxide-containing coating after the first polishing step is polished with a second polishing composition.

The metal oxide-containing coating formed in such a manner as described above is subjected to the first polishing step. In the first polishing step, typically, a polishing slurry (first polishing slurry) comprising the first polishing composition is supplied to a polishing plate and polishing is carried out by a usual method. For example, a work piece (an article to be polished, i.e. a metal oxide-coated article) is set in a general polishing machine and the polishing slurry is supplied onto the polishing plate and the surface (a surface to be polished) of the work piece. In typical, while the polishing slurry is continuously supplied, a polishing pad attached to the polishing plate is pushed against the surface of the work piece, and the two are moved (e.g. moved in circular motion) in coordination. As the first polishing composition, a composition described later can be preferably used.

The first polishing step is preferably carried out so that the metal oxide-containing coating will have a surface roughness Ra of 500 nm or less after the first polishing step. This enables the second polishing step to efficiently yield certain luster. The first polishing step is carried out more preferably so that after the first polishing step, the metal oxide containing coating will have a surface roughness Ra of 400 nm or less, or even more preferably so that the surface roughness Ra will be 300 nm or less (e.g. 250 nm or less, typically 200 nm or less).

Subsequently, the surface of the metal oxide-containing coating after the first polishing step is polished with the second polishing composition (second polishing step). In the second polishing step, typically, a polishing slurry (second polishing slurry) comprising the second polishing composition is supplied to a polishing plate and polishing is carried out by a usual method, similarly to the first polishing step. From the standpoint of preventing residue from the first polishing composition, after the first polishing step, the work piece is preferably rinsed with a rinse solution. As the second polishing composition, a composition described later can be preferably used.

The second polishing step can bring about the metal oxide-containing coating provided on the substrate surface to have a 20° gloss value of 50 or higher (preferably 70 or higher, more preferably 80 or higher, yet more preferably 90 or higher). It may cause the metal oxide-containing coating to have a surface roughness Ra of 350 nm or less (preferably 300 nm or less, more preferably 200 nm or less, particularly preferably 150 nm or less).

The first polishing step and the second polishing step are each preferably completed in two hours or less. In other words, the polishing time in each polishing step is preferably two hours or less. When the polishing time is too long, the productivity of the metal oxide-coated article may decrease. The polishing time in this description refers to the time from the start to the finish of the polishing, not including any time period related to the preparation for the polishing such as work piece setting, polishing pad replacement, etc. The polishing time in each polishing step is more preferably one hour or less.

For the polishing machine used in the first and second polishing steps, a conventionally known polishing machine, a commercial polishing machine, or a partially modified system thereof may be suitably employed. For the polishing pad, a conventionally known pad can also be suitably used. For example, pads made of polyurethane, non-woven fabric, suede and so forth, can be used.

There are no particular limitations to the polishing pressure, plate rotational speed or flow rate of polishing slurry in either the first or second polishing step. From the standpoint of efficiently producing certain surface luster and preventing deformation of the work piece, etc., the polishing pressure is suitably in a range of about 20 g/cm$^2$ to 1000 g/cm$^2$ (e.g. 50 g/cm$^2$ to 600 g/cm$^2$) or preferably in a range of 100 g/cm$^2$ to 700 g/cm$^2$ (preferably 300 g/cm$^2$ to 600 g/cm$^2$). From the standpoint of efficiently producing certain surface luster, the plate rotational speed can be, for instance, 50 rpm to 150 rpm (preferably 70 rpm to 120 rpm). From the standpoint of supplying a sufficient amount of the polishing slurry to the polishing pad and efficiently producing certain surface luster, the flow rate of the polishing slurry can be, for instance, 5 mL/min to 50 mL/min (preferably 10 mL/min to 40 mL/min).

Via the first and second polishing steps as described above, the polishing of the work piece can be completed. These polishing steps can be part of the manufacturing process of the metal oxide-coated article. Thus, to an extent acceptable in terms of the productivity, to produce aiming surface luster, the production method disclosed herein may further include an additional polishing step before the first polishing step, between the first and second polishing steps, and/or after the second polishing step. Such an additional polishing step can be performed by suitably employing a similar method as the conventional art. For instance, polishing performed before the first polishing step (which may be called preliminary polishing or rough polishing) may be oriented more to the polishing efficiency when compared with the first polishing step. Polishing performed after the second polishing step may be focused more on the surface luster. From the standpoint of the productivity, etc., the polishing time in the additional polishing step is preferably about 30 minutes or less (e.g. 20 minutes or less, typically 10 minutes or less). The other polishing conditions (e.g. polishing slurry supply rate, plate rotational speed, polishing pressure, material of the polishing pad, etc.) in the additional polishing step can be suitably selected based on the conventional art.

From the standpoint of the productivity, the total polishing time for the metal oxide-containing coating is preferably less than three hours (e.g. less than two hours, typically less than one and a half hours). Similarly, the polishing time (T1) in the first polishing step and the polishing time (T2) in the second polishing step preferably add to a total polishing time (T1+T2) of less than three hours. The total polishing time (T1+T2) can be achieved by considering the surface smoothness that can be efficiently produced by the first polishing step and the polishing efficiency of the second polishing step that can produce certain luster. This will further increase the productivity of the metal oxide-coated article having certain luster. The total polishing time (T1+T2) is more preferably less than two hours. When the polishing of the metal oxide-containing coating consists of the first and second polishing steps, it is particularly preferable that the total polishing time (T1+T2) is within these ranges. It is noted, that the total time of the polishing can be 30 minutes or more.

From the standpoint of the productivity, the polishing amount is preferably less than 100 μm (e.g. less than 70 μm, typically less than 50 μm). Even when the polishing amount is that low, the production method disclosed herein can produce a metal oxide-containing coating surface having a surface roughness Ra of 300 nm or less and a 20° gloss value of 50 or higher. The lower limit of total polishing amount is not particularly limited. To produce fine surface luster, it can be 10 μm or greater (e.g. 30 μm or greater). Considering the polishing amount, the metal oxide-containing coating before polished desirably has a thickness of 50 μm or larger (e.g. 100 μm or larger, typically 200 μm or larger).

According to the metal oxide-coated article production method disclosed herein, by subjecting a hard metal oxide-containing coating having a Vickers hardness of 350 or higher to at least two steps of polishing as described above, a surface having certain luster can be efficiently produced. As a result, the article's surface can be provided with a texture (typically luxurious quality) different from the conventional work. The article surface may have an aesthetic appearance and luxurious quality different from, but comparable to or greater than, those of, for instance, pottery and porcelain as fine arts and crafts. These features have never been obtained or even studied especially with respect to articles for general consumers, and thus are expected to be received as attractive and significant features in various applications. With respect to the article having such an attractive and significant metal oxide-containing coating on the surface, the production method disclosed herein allows for mass production. Thus, the metal oxide-coated article production method disclosed herein can be practical and useful in industrial aspects such as productivity.

<<Polishing Kit>>

The polishing kit according to a preferable embodiment of the art disclosed herein is described next. The work piece to be polished with the polishing kit is a metal oxide-containing coating comprising a metal oxide and having a Vickers hardness of 350 or higher. The polishing kit is used for polishing the metal oxide-containing coating to a surface roughness Ra of 300 nm or less and a 20° gloss value of 50 or higher. The polishing kit can be particularly preferably used for the metal oxide-coated article production method disclosed herein. The polishing kit comprises a first polishing composition to be supplied to the metal oxide-containing coating and a second polishing composition to be supplied to the metal oxide-containing coating after the supply of the first polishing composition.

<First Polishing Composition>
(Abrasive (A1))

The first polishing composition comprises an abrasive (A1). The abrasive (A1) has an average secondary particle diameter of preferably larger than 0.5 μm, more preferably 0.8 μm or larger, or yet more preferably 1 μm or larger. An abrasive (A1) with a large average secondary particle diameter can achieve a higher polishing rate. The average secondary particle diameter of abrasive (A1) is preferably 20 μm or smaller more preferably 10 μm or smaller, or yet more preferably 5 μm or smaller (e.g. 3 μm or smaller). With decreasing average secondary particle diameter of abrasive (A1), the coarse particle content, which can cause scratches, will decrease, whereby the number of scratches remaining on the polished surface after polished with the second polishing composition (second polishing step) can be reduced and the surface roughness Ra of the polished surface will decrease as well. In the art disclosed herein, the average secondary particle diameter of an abrasive is measured based on the laser diffraction/scattering method. The measurement can be made with, for instance, a laser diffraction/scattering particle size analyzer (trade name "LA-950") available from Horiba, Ltd.

The abrasive (A1) has an average primary particle diameter of preferably 5 nm or larger, more preferably 10 nm or larger, or yet more preferably 20 nm or larger. With increasing average primary particle diameter, a higher polishing rate can be achieved. From the standpoint of increasing the surface smoothness, the average primary particle diameter is preferably 500 nm or smaller, or more preferably 200 nm or smaller. In the art disclosed herein, the average primary particle diameter of an abrasive can be determined from the specific surface area (m²/g) measured by a BET method unless otherwise informed. The measurement can be made with, for instance, a specific surface area analyzer (trade name "FLOW SORBII 2300") available from Micromeritics Instrument Corp.

In the art disclosed herein, an abrasive (A1) formed of a material having a Mohs hardness of 6 or higher (e.g. 7 to 9.9, typically 8 to 9.9) can be preferably used. When the abrasive (A1) is formed of two or more kinds of material, the hardness of abrasive (A1) can be determined by multiplying the Mohs hardness by the mass ratio for each material, and combining the resulting products.

Examples of the material forming the abrasive (A1) include alumina, zirconia, ceria, titania, silica, chromium oxide, iron oxide, silicon carbide, boron carbide, silicon nitride, manganese oxide, etc. Among these, one, two or more species can be used as the abrasive (A1). In particular, silicon carbide and alumina are preferable for they can yield excellent polishing rates. Alternatively, a combination of silicon carbide and zircon can be preferably used as well. When the abrasive (A1) comprises silicon carbide and/or alumina, the content of silicon carbide and/or alumina in the abrasive (A1) is preferably 70% by mass or greater, more preferably 80% by mass or greater, or yet more preferably 90% by mass or greater. The art disclosed herein can be preferably implemented in an embodiment where the abrasive (A1) in the first polishing composition consists of a silicon carbide abrasive and/or an alumina abrasive.

(Other Components)

The first polishing composition disclosed herein may further comprise, as necessary one, two or more species of known ingredients (additives) that can be contained in polishing compositions (typically polishing compositions for hard coatings), such as an etching agent to accelerate dissolution of an alloy material; oxidant to oxidize the surface of the alloy material; water-soluble polymer, copolymer, its salt or derivative to act on the surfaces of the alloy material and the abrasive; anticorrosive to inhibit corrosion of the surface of the alloy material; chelating agent; dispersing agent to facilitate re-dispersion of an abrasive aggregate; preservative; antifungal agent; and so on.

Examples of etching agent include inorganic acids such as nitric acid, sulfuric acid, phosphoric acid, etc.; organic acids such as acetic acid, citric acid, tartaric acid, methanesulfonic acid, etc.; inorganic bases such as potassium hydroxide, sodium hydroxide, etc.; ammonia; organic bases such as amines, quaternary ammonium hydroxide, etc.; and so on.

Examples of oxidant include hydrogen peroxide, peracetic acid, percarbonates, urea peroxide, perchlorates, persulfates, etc.

Examples of water-soluble polymers, copolymers, their salts and derivatives include polycarboxylic acids such as polyacrylic acids and salts thereof, etc.; polyphosphoric acid; polysolfonic acids such as polystyrene-sulfonic acid, etc.; polysaccharides such as xanthan gum, sodium alginate, etc.; cellulose derivatives such as hydroxyethyl cellulose, carboxymethyl cellulose, etc.; polyethylene glycol; polyvinyl alcohol; polyvinyl pyrrolidone; polyoxyethylene alkyl ethers; polyoxyethylene alkyl phenyl ethers; sorbitan monooleate; oxyalkylenic polymers having a single or several species of oxyalkylene moiety; and the like.

Examples of anticorrosive include amines, pyridines, tetraphenylphosphoniuim salts, benzotriazoles, triazoles, tetrazoles, benzoic acid, etc.

Examples of chelating agent include carboxylic acid-based chelating agents such as gluconic acid; amine-based chelating agents such as ethylene diamine, diethylene triamine, trimethyltetramine; polyaminopolycarboxylic chelating agents such as ethylenediaminetetraacetic acid, nitrilotriacetic acid, hydroxyethylethylenediaminetriacetic acid, triethylenetraminehexaacetic acid, diethylenetriaminepentaacetic acid; organic phosphonic acid-based chelating agents such as 2-aminoethylphosphonic acid, 1-hydroxyethylidene-1,1-diphosphoric acid, amino tri(methylenephosphonic acid), ethylenediamine tetrakis(methylenephosphonic acid), diethylenetriamine penta(methylenephosphonic acid), ethane-1,1-diphosphonic acid, ethane-1,1,2-triphosphonic acid, methane hydroxyl diphosphonic acid, 1-phosphonobutane-2,3,4-tricarboxylic acid, etc.; phenol derivatives; 1,3-diketones; and the like.

Examples of dispersing agent include condensed phosphates such as pyrophosphates, hexametaphosphates, and the like.

Examples of preservative include sodium hypochlorite and the like.

Examples of antifungal agent include oxazolines such as oxazolidine-2,5-dione and the like.

(Aqueous Solvent)

The first polishing composition disclosed herein typically comprises an aqueous solvent besides the abrasive. The concept of the "aqueous solvent" herein includes water and mixed solvents including water as the main component. The term "mixed solvent including water as the main component" typically refers to a mixed solvent having more than 50% water content by volume. Ion-exchanged water (deionized water), distilled water, and pure water can be used as the water. For the other solvents besides water to constitute the mixed solvent, organic solvents (lower alcohols, etc.) that can be uniformly mixed with water can be used. Usually it is preferable to use an aqueous solvent containing water at 80% by volume or more (more preferably 90% by volume or more, even more preferably 95% by volume or more). A particularly preferable example is an aqueous solvent consisting essentially of water (for example, an aqueous solvent containing 99.5 to 100% by volume of water). The first polishing composition (typically, a slurry composition) disclosed herein can be preferably made, for example, in an embodiment in which the solid content (non-volatile content; NV) is 5 g/L to 500 g/L. An embodiment in which the NV is 10 g/L to 350 g/L is more preferable.

(Polishing Slurry)

The first polishing composition disclosed herein is typically supplied to a work piece (metal oxide-containing coating) in a form of a polishing slurry (first polishing slurry) comprising the first polishing composition when used in polishing the work piece. The polishing slurry can be prepared, for instance, by diluting the first polishing composition. Alternatively, the first polishing composition can be used straight as the polishing slurry. The concept of polishing composition in this description encompasses a polishing slurry and a liquid concentrate which is diluted for use.

The abrasive content in the polishing slurry (when several abrasive species are contained, their total content) is typically 5 g/L or greater, preferably 10 g/L or greater, or more preferably 30 g/L or greater. With increasing abrasive content, a higher polishing rate can be achieved. From the standpoint of the surface smoothness of the metal oxide-containing coating and consistency of the polishing, usually, the abrasive content is suitably 500 g/L or less, preferably 400 g/L or less, more preferably 300 g/L or less, or yet more preferably 150 g/L or less.

The pH of the polishing slurry may be suitably selected from a range of about 1 to 12 (e.g. 1.5 to 11, typically 2 to 10). For instance, the pH of the polishing slurry can be 0.5 or higher (e.g. 1 or higher, typically 2 or higher), and also 8 or lower. Alternatively, the pH can be 7.0 or higher, and also 12 or lower (typically 11.0 or lower, preferably 10.5 or lower). To yield such a pH, the polishing slurry may contain, as necessary, a pH-adjusting agent such as an organic acid, inorganic acid, organic base, inorganic base, etc. With respect to the amount of other additive(s) possibly contained in the first polishing composition, a suitable range can be applied based on a similar range to a conventional polishing composition.

The polishing composition (meaning to encompass the first polishing composition and the second polishing composition) disclosed herein may be a single-pack type or a multi-pack type such as a two-pack type. For example, it may be formulated such that a liquid (slurry) A comprising some of the components (typically ingredients other than an aqueous solvent) of the polishing composition is mixed with a liquid (slurry) B comprising the rest of the components, and the mixture is used for polishing a work piece.

The respective components of the polishing composition disclosed herein are preferably subjected to filtration with filters just before the preparation. The polishing composition is preferably used also after filtration with a filter just before the use. The filtration removes coarse substances from the polishing composition to increase the quality. The material and structure of the filter that can be used in the filtration is not particularly limited, and a heretofore known filter can be suitably used.

(liquid Concentrate)

The polishing composition disclosed herein (with the term being used to include the first polishing composition and the second polishing composition) may be in a liquid concentrate form (i.e. in a form of a polishing liquid concentrate) before supplied to a polishing object. The polishing composition in such a concentrated form is advantageous from the standpoint of the convenience and cost reduction, etc., during manufacture, distribution and storage, etc. The concentration ratio can be, for example, about 1.5 times to 50 times. From the standpoint of the storage stability of the liquid concentrate, etc., the appropriate concentration ratio is usually 2 times to 20 times (typically, 2 times to 10 times).

The polishing composition in the liquid concentrate form can be advantageously used in an embodiment in which the polishing composition is diluted at a desirable time to prepare a polishing slurry and the polishing slurry is supplied to a work piece to be polished. The dilution is typically performed by adding the aforementioned aqueous solvent to the liquid concentrate and mixing. When the aqueous solvent is a mixed solvent, the dilution may be performed by adding only some components of the aqueous solvent, or by adding a mixed solvent containing the components at a different volume ratio than in the aqueous solvent.

The liquid concentrate can have an NV of, for example, 500 g/L or less. From the standpoint of the storage stability of the polishing composition (e.g. dispersion stability of abrasives), etc., the NV of the liquid concentrate is suitably 450 g/L or less, or preferably 350 g/L or less. From the standpoint of the convenience and cost reduction during manufacture, distribution and storage, etc., the NV of the liquid concentrate is suitably 10 g/L or greater, preferably 30 g/L or greater, or more preferably greater than 50 g/L, for example, greater than 100 g/L The abrasive content in the liquid concentrate can be, for example, less than 500 g/L. From the standpoint of the storage stability of the polishing composition, etc., the abrasive content is suitably less than 450 g/L or preferably less than 350 g/L. From the standpoint of the convenience and cost reduction during manufacture, distribution, and storage, etc., the abrasive content can be, for example, 10 g/L or greater, preferably 20 g/L or greater, or more preferably 30 g/L or greater (e.g. 50 g/L or greater).

The first polishing composition constituting the polishing kit disclosed herein can be contained in a container, for instance, as a polishing liquid as described above (or as a liquid concentrate). Alternatively for instance, when the first polishing composition is a multi-pack type such as a two-pack type, etc., the first polishing composition may be divided and contained in two or more containers.

<Second Polishing Composition>
(Abrasive (A2))

The second polishing composition comprises an abrasive (A2). The abrasive (A2) has a smaller average secondary particle diameter than the abrasive (A1). The average secondary particle diameter of the abrasive (A2) is 500 nm or smaller. From the standpoint of efficiently producing certain luster, the average secondary particle diameter of the abrasive (A2) is suitably about 30 nm or larger, or preferably 50 nm or larger (e.g. 70 nm or larger, typically 90 nm or larger). From the same standpoint, the average secondary particle diameter of the abrasive (A2) is preferably about 300 nm or smaller, or more preferably 200 nm or smaller. The average secondary particle diameter of the abrasive (A2) can be measured based on dynamic light-scattering. The measurement can be made with, for instance, a particle size analyzer (trade name "NANOTRAC WAVE-UT151") available from Nikkiso Co., Ltd.

The abrasive (A1) has an average secondary diameter $P_1$ and the abrasive (A2) has an average secondary particle diameter $P_2$, and the ratio ($P_1/P_2$) of average secondary particle diameter $P_1$ of abrasive (A1) to average secondary particle diameter $P_2$ of abrasive (A2) is preferably in a range of 2 to 200 (e.g. 3 to 90, typically 5 to 45). With the abrasive (A1) to abrasive (A2) average secondary particle diameter ratio ($P_1/P_2$) being in this range, a surface having certain luster can be efficiently produced.

The abrasive (A2) has an average primary particle diameter of preferably 10 nm or larger, more preferably 15 nm or larger, or even more preferably 20 nm or larger. With increasing average primary particle diameter, a higher polishing rate can be obtained. From the standpoint of obtaining a surface with a higher degree of luster, the average primary particle diameter is preferably 150 nm or smaller (e.g. 120 nm or smaller, typically 100 nm or smaller).

The abrasive (A2) preferably has a lower Mohs hardness than the abrasive (A1). The use of the abrasive (A2) having a relatively low Mohs hardness as the abrasive of the second polishing composition is likely to yield certain luster. The Mohs hardness of the abrasive (A2) is preferably lower by 0.5 or more (e.g. by 1 or more, typically by 2 to 6) than the Mohs hardness of the abrasive (A1). Typically, the Mohs hardness of the abrasive (A2) can be 8 or lower (e.g. about 4 to 8, typically 5 to 7). When the abrasive (A2) is constituted with two or more species of material, the hardness of the abrasive (A2) can be determined by multiplying the Mohs hardness by the mass ratio for the respective materials and combining their products.

Examples of the material constituting the abrasive (A2) disclosed herein include silica species such as colloidal, silica, fumed silica, precipitated silica and the like as well as alumina, titania, zirconia, ceria, etc. These can be used singly as one species or as a mixture of two or more species. In particular, silica species are preferable. Among them, colloidal silica and turned silica are particularly preferable. When the abrasive (A2) comprises a silica, the silica content in the abrasive (A2) is preferably 70% by mass or greater, more preferably 80% by mass or greater, or particularly preferably 90% by mass or greater. The art disclosed herein can be preferably implemented in an embodiment where the abrasive (A2) in the second polishing composition consists of a silica abrasive.

(Other Components)

The second polishing composition disclosed herein may further comprise, as necessary, one, two or more species of known ingredients (additives) that can be contained in polishing compositions (typically polishing compositions for hard coatings), such as an etching agent to accelerate dissolution of an alloy material; oxidant to oxidize the surface of the alloy material; water-soluble polymer, copolymer, its salt or derivative to act on the surfaces of the alloy material and the abrasive; anticorrosive to inhibit corrosion of the surface of the alloy material; chelating agent; dispersing agent to facilitate re-dispersion of an abrasive aggregate; preservative; antifungal agent; and so on. These ingredients are basically the same as those exemplified with respect to the first polishing composition and thus their particulars are not repeated here.

(Aqueous Solvent)

As for the aqueous solvent in the second polishing composition disclosed herein, the same kinds as the aqueous solvent of the aforementioned first polishing composition can be preferably used. The solid content in the second polishing composition (typically a slurry composition) can be preferably selected from the same ranges as the solid content in the first polishing composition.

(Polishing Slurry)

The second polishing composition disclosed herein is typically supplied to the work piece (metal oxide-containing coating) in a form of a polishing slurry (second polishing slurry) comprising the second polishing composition when used in polishing the work piece. The polishing slurry can be prepared, for instance, by diluting the second polishing composition. Alternatively, the second polishing composition can be used straight as the polishing slurry.

The abrasive content in the polishing slurry (when several abrasive species are contained, their total content) is typically 1% by mass or greater, preferably 2% by mass or greater, more preferably 7% by mass or greater, or yet more preferably 10% by mass or greater. With increasing abrasive content, the surface luster can be increased in shorter time. In view of the dispersion stability of the abrasive in the polishing slurry consistency of the polishing, handling of the polishing slurry, and so on, the abrasive content is suitably 50% by mass or loss, or preferably 40% by mass or less.

The pH of the polishing slurry may be suitably selected from a range of about 1 to 12 (e.g. 2 to 11, typically 3 to 10.5). For instance, the pH of the polishing slurry can be 6.0 or higher, and also 12 or lower. To yield such a pH, as necessary, the polishing slurry may contain a pH-adjusting agent such as an organic acid, inorganic acid, organic base, inorganic base, etc. With respect to the amount of other additive(s) possibly contained in the second polishing composition, a suitable range can be applied based on a similar range as a conventional polishing composition.

The second polishing composition constituting the polishing kit disclosed herein can be contained in a container, for instance, as a polishing liquid as described above (or a liquid concentrate). Alternatively, for instance, when the second polishing composition is a multi-pack type such as a two-pack type, etc., the second polishing composition may be divided and contained in two or more containers.

<Other Features>

The polishing kit disclosed herein comprises the first polishing composition and the second polishing composition described above, and may further comprise supplemental components. For instance, when the metal oxide-coated article production method includes an additional polishing step before the first polishing step, between the first and second polishing steps, and/or after the second polishing step, the polishing kit may comprise a polishing composition (typically a polishing slurry) that can be used in the additional polishing step. For instance, polishing performed before the first polishing step (which may be called preliminary polishing or rough polishing) may be oriented more to the polishing efficiency when compared with the first polishing step. Thus, the kit preferably comprises a polishing composition (typically a polishing slurry or a liquid concentrate) comprising an abrasive (e.g. $B_4C$ abrasive) having an average secondary particle diameter larger than 20 μm (e.g. an abrasive having an average secondary particle diameter of 30 μm to 70 μm). The polishing composition that can be used in the polishing performed between the first and second polishing steps may comprise an abrasive whose average secondary particle diameter is smaller than that of the abrasive (A1), but larger than that of the abrasive (A2). For the polishing composition that can be used in the polishing step after the second polishing step, it is preferable to use a polishing composition comprising an abrasive having an average secondary particle diameter similar to or smaller than that of the abrasive (A2).

Polishing with the metal oxide-containing coating polishing kit disclosed herein can efficiently produce a surface having certain luster on a metal oxide-containing coating having at least the prescribed hardness. Accordingly, it is particularly preferable in producing an article having a metal oxide-containing coating having a Tickers hardness of 350 or higher, a surface roughness Ra of 300 nm or less and a 20° gloss value of 50 or higher. In other words, the metal oxide-containing coating polishing kit disclosed herein can be applied to allow for mass production of an article having a different texture (luxurious quality) from conventional kinds. The resulting metal oxide-coated article may be attractive and significant, having an aesthetic appearance and luxurious quality different from, but comparable to or greater than, those of for instance, pottery and porcelain as fine arts and crafts.

Several worked examples relating to the present invention are described below although the present invention is not to be limited to what are indicated in these worked examples. In the description below "parts" and "%" are based on the mass unless otherwise specified.

EXAMPLE 1

[Formation of Metal Oxide-Containing Coating]

On a surface (blast finish) of a 5 mm thick aluminum, alloy thin plate (size: 50 mm by 50 mm), a 300 μm thick alumina spray coating (metal oxide-containing coating) was formed by a plasma spraying method. The plasma spraying was carried out under the conditions indicated below. As for the spray powder, were used spray particles with a $D_{50}$ of 27.0 μm up to a coating thickness of 200 μm and spray particles with a $D_{50}$ of 10.1 μm from 200 μm up to 300 μm in coating thickness.

(Conditions of Plasma Spraying)

Spray system: SG-100 available from Praxair Technology Inc.

Powder feeder: Model 1264 available from Praxair Technology, Inc.

Ar gas pressure: 0.34 MPa

He gas pressure: 0.34 MPa

Current: 900 A

Voltage: 35.6V

Spray distance: 150 mm.

[Polishing of Metal Oxide-Containing Coating]

The metal oxide-coated aluminum alloy plate (work piece sample) was set in a polishing machine. The first polishing slurry was supplied to the polishing plate and polishing was performed (first polishing step). After the completion of the first polishing step, the work piece sample was collected and set in a different polishing machine from the polishing machine used in the first polishing step. The second polishing slurry was then supplied to the polishing plate and polishing was performed (second polishing step). As the first polishing slurry, a polishing slurry containing a silica carbide (SiC) abrasive (abrasive (A1)) of 1.2 μm average secondary particle diameter at a concentration of 100 g/L was used. As the second polishing slurry, a polishing slurry containing a colloidal silica abrasive ($SiO_2$ (A), (abrasive (A2)) of 100 nm average secondary particle diameter at a concentration of 20% was used. For the second polishing slurry, for pH adjustment, potassium hydroxide (KOH) was used at a concentration below 1%. The average secondary particle diameter of the abrasive (A1) was measured with a laser diffraction/scattering particle size analyzer "LA-950" available from Horiba, Ltd. The average secondary particle diameter of the abrasive (A2) was measured with a particle size analyzer "NANOTRAC WAV-UT151" available from Nikkiso Co., Ltd. The polishing conditions of the first and second polishing steps are shown below. Table 1 shows the outlines (species and average secondary particle diameter (μm) of abrasive, polishing time (min), polishing rate (μm/min)) of the first and second polishing steps. The same applies with Examples 2 to 10 described later.

(Polishing Conditions of the First Polishing Step)

Polishing machine: single-faced polishing system. "EJ-380IN" (plate diameter 380 mm) available from Engis Japan Corporation Polishing pad: non-woven fabric pad Polishing pressure: 517 g/cm$^2$ Plate rotational speed: 100 rpm Polishing time: 30 min Polishing slurry supply rate: 14 mL/min (Polishing Conditions of the Second Polishing Step)

Polishing machine: same as above

Polishing pad: suede pad

Polishing pressure: 517 g/cm$^2$

Plate rotational speed: 100 rpm

Polishing time: 30 min

Polishing slurry supply rate: 14 mL/min

EXAMPLE 2

As the first polishing slurry, a polishing slurry containing 250 g/L of an alumina abrasive ($Al_2O_3$, abrasive (A1)) of 1.3 μm average secondary particle diameter and 62 g/L of citric acid was used. Otherwise in the same manner as Example 1, polishing was carried out.

EXAMPLE 3

As the second polishing slurry, a polishing slurry containing 13% of a fumed silica abrasive ($SiO_2$ (B), abrasive (A2)) of 130 nm average secondary particle diameter was used. Otherwise in the same manner as Example 2, polishing was carried out. For the second polishing slurry for pH adjustment, KOH was used at a concentration below 1%.

EXAMPLE 4

A surface (blast finish) of a 5 mm thick aluminum alloy thin plate (size: 50 mm by 50 mm) was subjected to plasma spray coating using a $Y_2O_3$ spray powder to form a 300 μm thick $Y_2O_3$ spray coating (metal oxide-containing coating). The resulting metal oxide-containing coating was polished with the same polishing slurries as Example 2.

EXAMPLE 5

A surface (blast finish) of a 5 mm thick aluminum alloy thin plate (size: 50 mm by 50 mm) was subjected to plasma spray coating using a $ZrO_2$-15% $Er_2O_3$ spray powder to form a 300 μm thick spray coating (metal oxide-containing coating). The resulting metal oxide-containing coating was polished with the same polishing slurries as Example 2.

EXAMPLE 6

A surface (blast finish) of a 5 mm thick aluminum alloy thin plate (size 50 mm by 50 mm) was subjected to plasma spray coating using a $(Fe,Mg)Cr_2O_4$ spray powder to form, a 300 μm thick spray coating (metal oxide-containing coating). The resulting metal oxide-containing coating was polished with the same polishing slurries as Example 2.

EXAMPLE 7

As the first polishing slurry a polishing slurry containing 250 g/L of a zirconia abrasive ($ZrO_2$) of 0.8 μm average secondary particle diameter was used. Otherwise in the same manner as the first polishing step in Example 1, polishing was carried out. In this example, the second polishing step was not performed.

EXAMPLE 8

In the same manner as Example 1 except that the second polishing step was not performed, polishing of the metal oxide-containing coating was performed.

EXAMPLE 9

As the second polishing slurry, a polishing slurry containing 250 g/L of a zirconia abrasive ($ZrO_2$) of 0.8 μm average secondary particle diameter was used. Otherwise in the same manner as Example 1, polishing was carried out. The average secondary particle diameter of the zirconia abrasive was measured with the laser diffraction/scattering particle size analyzer "LA-950" available from Horiba, Ltd.

EXAMPLE 10

As the second polishing slurry, a polishing slurry containing 250 g/L of an alumina abrasive ($Al_2O_3$) of 1.3 μm average secondary particle diameter and 62 g/L of citric acid was used. Otherwise in the same manner as Example 1, polishing was carried out. The average secondary particle diameter of the alumina abrasive was measured with the laser diffraction/scattering particle size analyzer "LA-950" available from Horiba, Ltd.

[Vickers Hardness]

The surfaces of metal oxide-containing coatings according to the respective example were measured for the Vickers hardness based on JIS R1610. The results are shown in Table 1.

[Surface Roughness Ra]

With respect to each example, prior to polishing, after the completion of the first polishing step and after the completion of the second polishing step, the metal oxide-containing coating was measured for the surface roughness Ra. The measurements were taken over a measured length of 10 mm, at a measurement rate of 0.3 mm/sec, using a surface roughness tester "SURFCOM 1500DX" available from Tokyo Seimitsu Co., Ltd. The results are shown in Table 1. FIG. 1 shows changes in surface roughness Ra during polishing according to Example 3. FIG. 2 to FIG. 4 show charts of surface roughness Ra data (cross-sectional curves) prior to polishing (point A), after the completion of the first polishing step (point B) and after the completion of the second polishing step (point C), respectively. FIG. 5 and FIG. 6 show the charts of FIG. 3 and FIG. 4 magnified by 10× in the vertical direction.

[20° Gloss Value]

With respect to each example, after the completion of the second polishing, the surface of the metal oxide-containing coating was measured for the 20° gloss value based on JIS Z8741. The measurements were taken with a gloss meter "GM-268 PLUS" available from Konica Minolta Optics, Inc. The results are shown in Table 1.

TABLE 1

|  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Metal oxide-containing coating |  |  |  |  |  |  |  |  |  |  |
| Materials | $Al_2O_3$ | $Al_2O_3$ | $Al_2O_3$ | $Y_2O_3$ | $ZrO_2$-15% $Er_2O_3$ | (Fe, Mg)$Cr_2O_4$ | $Al_2O_3$ | $Al_2O_3$ | $Al_2O_3$ | $Al_2O_3$ |
| Vickers hardness (Hv) | 900-1000 | 900-1000 | 900-1000 | 400-500 | 400-500 | 800-900 | 900-1000 | 900-1000 | 900-1000 | 900-1000 |

TABLE 1-continued

|  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Prior to polishing |  |  |  |  |  |  |  |  |  |  |
| Surface roughness Ra (nm) | 3906 | 4276 | 4189 | 5115 | 6314 | 3787 | 4037 | 4069 | 4010 | 3933 |
| First polishing step |  |  |  |  |  |  |  |  |  |  |
| Abrasive | SiC | $Al_2O_3$ | $Al_2O_3$ | $Al_2O_3$ | $Al_2O_3$ | $Al_2O_3$ | $ZrO_2$ | SiC | SiC | SiC |
| Average secondary particle diameter | 1.2 μm | 1.3 μm | 1.3 μm | 1.3 μm | 1.3 μm | 1.3 μm | 0.8 μm | 1.2 μm | 1.2 μm | 1.2 μm |
| Polishing time (min) | 30 | 30 | 30 | 15 | 45 | 30 | 75 | 30 | 30 | 30 |
| Polishing rate (μm/min) | 0.58 | 0.60 | 0.64 | 3.32 | 0.84 | 1.32 | 0.03 | 0.62 | 0.58 | 0.55 |
| Surface roughness Ra (nm) | 262 | 196 | 208 | 128 | 261 | 200 | 2481 | 342 | 283 | 332 |
| Second polishing step |  |  |  |  |  |  |  |  |  |  |
| Abrasive | $SiO_2$ (A) | $SiO_2$ (A) | $SiO_2$ (B) | $SiO_2$ (A) | $SiO_2$ (A) | $SiO_2$ (A) | — | — | $ZrO_2$ | $Al_2O_3$ |
| Average secondary particle diameter | 100 nm | 100 nm | 130 nm | 100 nm | 100 nm | 100 nm |  |  | 0.8 μm | 1.3 μm |
| Polishing time (min) | 30 | 30 | 30 | 30 | 30 | 30 |  |  | 30 | 30 |
| Polishing rate (μm/min) | 0.14 | 0.11 | 0.12 | 0.47 | 0.53 | 0.17 |  |  | 0.04 | 0.42 |
| Surface roughness Ra (nm) | 83 | 81 | 66 | 43 | 54 | 71 |  |  | 220 | 234 |
| 20° gloss value | 100 | 101 | 102 | 130 | 206 | 205 | 1 | 20 | 25 | 21 |

As shown in Table 1, with respect to Examples 1 to 8, despite that the metal oxide-containing coatings were as hard as 350 or higher (specifically 400 or higher) Vickers hardness, short-time polishing (specifically two hours or less) produced a surface roughness Ra of 300 nm or less (specifically 100 nm or less) and a 20° gloss value of 50 or higher (specifically 100 or higher) in every example. From the results of Examples 4 to 6, it can be found that even if the material of the metal oxide-containing coating is altered, the surface can obtain a 20° gloss value of 50 or higher. From this, it can be found that the art disclosed herein can be applied to various metal oxide-containing coatings. On the other hand, Examples 7 and 8 resulted in 20° gloss values of 20 or lower and surface luster was not obtained, A 20° gloss value of 50 or higher was not obtained in Example 9 or 10, either. In these examples, the surface roughness Ra values were relatively high (specifically 200 nm or higher). The porosity was measured for the metal oxide-containing coatings according to Examples 1 to 6 which had 20° gloss values of 50 or higher and found to be in the range of 1% to 20%.

Although specific examples of the present invention have been described in detail above, these are merely for illustrations and do not limit the scope of the claims. The invention disclosed herein includes various modifications and changes made to the specific examples illustrated above.

The invention claimed is:

1. An article having a metal oxide-containing coating, the article comprising a substrate and a metal oxide-containing coating provided to a surface of the substrate, wherein
the metal oxide-containing coating has a Vickers hardness of 500 or higher, a surface roughness Ra of 300 nm or less, and a 20° gloss value of 50 or higher,
the thickness of the metal oxide-containing coating is 50 μm or larger,
the metal oxide-containing coating has a porosity of 1 to 20%, and
the metal oxide-containing coating consists of a spray layer having a multi-layer structure with two or more layers.

2. The article according to claim 1, wherein the metal oxide-containing coating is a coating formed by a spraying method.

3. The article according to claim 1, wherein the metal oxide-containing coating has a thickness of 50 μm to 1000 μm.

4. A method for producing an article having a metal oxide-containing coating, the method comprising the steps of:
forming a metal oxide-containing coating having a Vickers hardness of 500 or higher above a surface of a substrate; and
polishing the surface of the metal oxide-containing coating, wherein
the metal oxide-containing coating after the polishing step has a surface roughness Ra of 300 nm or less and a 20° gloss value of 50 or higher,
wherein the metal oxide-containing coating consists of a spray layer having a multi-layer structure with two or more layers, wherein the thickness of the metal oxide-containing coating is 50 μm or larger, and the metal oxide-containing coating has a porosity of 1 to 20%.

5. The method according to claim 4, wherein the metal oxide-containing coating is formed by a spraying method.

6. The method according to claim 4, wherein the metal oxide-containing coating has a thickness of 50 μm to 1000 μm.

7. The method according to claim 4, wherein the polishing step comprises:
a first polishing step where the surface of the metal oxide-containing coating formed is polished with a first polishing composition; and
a second polishing step where the surface of the metal oxide-containing coating after the first polishing step is polished with a second polishing composition.

8. The method according to claim 7, wherein
the first polishing composition comprises an abrasive (A1),
the second polishing composition comprises an abrasive (A2) having a smaller average secondary particle diameter than the abrasive (A1), and
the average secondary particle diameter of the abrasive (A2) is 500 nm or smaller.

9. The method according to claim 7, wherein the abrasive (A1) has an average secondary particle diameter of 1 μm to 10 μm.

10. The method according to claim 7, wherein the abrasive (A1) has an average secondary particle diameter $P_1$ and the abrasive (A2) has an average secondary particle diameter $P_2$ at a ratio ($P_1/P_2$) of 2 to 200.

11. The article according to claim 1, wherein the thickness of the metal oxide-containing coating is 100 μm or larger.

12. The article according to claim 1, wherein the metal oxide-containing coating includes at least one species selected from the group consisting of Ca, Sr, Sc, Y, La, Zr, Hf, V, Ta, Cr, W, Mn, Co, Ni, Cu, Ag, Zn, Ga, In, Sn, Pb, Bi, Ce, Pr, Nd, Er and Lu.

13. The article according to claim 1, wherein the metal oxide-containing coating comprises at least one species selected from the group consisting of CaO, SrO, $Sc_2O_3$, $Y_2O_3$, $La_2O_3$, $ZrO_2$, $HfO_2$, $VO_X$, $Ta_2O_5$, $CrO_X$, $WO_X$, $MnO_X$, $CoO_X$, NiO, CuO, AgO, ZnO, $Ga_2O_3$, $In_2O_3$, $SnO_2$, $BiO_X$, $CeO_2$, $PrO_X$, $Nd_2O_3$, $Er_2O_3$, $Lu_2O_3$, $ZrSiO_X$, $ZrAlO_X$, $HfSiO_X$, $HfAlO_X$ and $TiSi_XO_Y$.

14. The article according to claim 1, wherein the metal oxide-containing coating has the surface roughness Ra of 83 nm or less.

15. The article according to claim 1, wherein the substrate comprises a stainless steel.

16. The article according to claim 1, wherein the thickness of the substrate is 0.1 mm or larger and 50 mm or smaller.

17. The article according to claim 1, wherein the thickness of the substrate is 1 mm or larger.

18. The article according to claim 1, wherein the metal oxide-containing coating includes at least one species selected from the group consisting of Ca, Sr, Sc, Y, La, Zr, Hf, V, Cr, W, Mn, Co, Ni, Cu, Ag, Zn, Ga, In, Sn, Pb, Bi, Ce, Pr, Nd, Er and Lu.

19. The article according to claim 1, wherein the metal oxide-containing coating comprises at least one species selected from the group consisting of CaO, SrO, $Sc_2O_3$, $Y_2O_3$, $La_2O_3$, $ZrO_2$, $HfO_2$, $VO_X$, $CrO_X$, $WO_X$, $MnO_X$, $CoO_X$, NiO, CuO, AgO, ZnO, $Ga_2O_3$, $In_2O_3$, $SnO_2$, $BiO_X$, $CeO_2$, $PrO_X$, $Nd_2O_3$, $Er_2O_3$, $Lu_2O_3$, $ZrSiO_X$, $ZrAlO_X$, $HfSiO_X$, $HfAlO_X$ and $TiSi_XO_Y$.

* * * * *